US012323174B2

(12) United States Patent
Khlat (10) Patent No.: US 12,323,174 B2
(45) Date of Patent: Jun. 3, 2025

(54) AMPLITUDE-TO-PHASE ERROR CORRECTION IN A TRANSCEIVER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 285 days.

(21) Appl. No.: 17/890,538

(22) Filed: Aug. 18, 2022

(65) Prior Publication Data

US 2023/0079153 A1 Mar. 16, 2023

Related U.S. Application Data

(60) Provisional application No. 63/245,151, filed on Sep. 16, 2021.

(51) Int. Cl.
*H04B 1/04* (2006.01)
*H04B 1/525* (2015.01)

(52) U.S. Cl.
CPC .......... *H04B 1/0475* (2013.01); *H04B 1/525* (2013.01)

(58) Field of Classification Search
CPC .. H04M 1/0214; H04M 1/026; H04M 1/0262; H04M 1/035; H04M 1/02;
(Continued)

(56) References Cited

U.S. PATENT DOCUMENTS 4,797,898 A 1/1989 Martinez
5,793,821 A * 8/1998 Norrell ................. H04L 7/0278
375/326
(Continued)

FOREIGN PATENT DOCUMENTS

BR 112015001348 A2 7/2017
CN 1151229 A 6/1997
(Continued)

OTHER PUBLICATIONS

International Search Report and Written Opinion for International Patent Application No. PCT/US2022/043600, mailed Jan. 11, 2023, 15 pages.
(Continued)

*Primary Examiner* — Nathan S Taylor
(74) *Attorney, Agent, or Firm* — Withrow & Terranova, P.L.L.C.

(57) ABSTRACT

Amplitude-to-phase (AM-PM) error correction in a transceiver circuit is provided. The transceiver circuit is configured to generate a radio frequency (RF) signal from a time-variant input vector for transmission in one or more transmission frequencies. In embodiments disclosed herein, the transceiver circuit is configured to determine a phase correction term from the time-variant input vector and apply the determined phase correction term to the time-variant input vector to thereby correct an AM-PM error(s) in the RF signal. By correcting the AM-PM error(s) in the transceiver circuit, it is possible to prevent undesired amplitude distortion and/or spectrum regrowth in any of the transmission frequencies, particularly when the RF signal is modulated across a wide modulation bandwidth (e.g., ≥200 MHz).

18 Claims, 8 Drawing Sheets

(58) Field of Classification Search
CPC ....... H04M 1/03; H04B 1/0475; H04B 1/525; H04B 1/04; H03F 1/3288; H03F 3/19; H03F 3/245
USPC ..................................................... 455/552.1
See application file for complete search history.

(56) References Cited

U.S. PATENT DOCUMENTS

| | | | |
|---|---|---|---|
| 6,275,685 B1 | 8/2001 | Wessel et al. | |
| 6,630,862 B1 | 10/2003 | Perthold et al. | |
| 6,760,451 B1* | 7/2004 | Craven .................. | H03G 5/005 381/59 |
| 6,806,767 B2 | 10/2004 | Dow | |
| 6,947,711 B1 | 9/2005 | Leyonhjelm | |
| 7,076,225 B2 | 7/2006 | Li et al. | |
| 7,170,342 B2 | 1/2007 | Suzuki et al. | |
| 7,430,248 B2 | 9/2008 | McCallister | |
| 7,583,754 B2 | 9/2009 | Liu | |
| 7,663,436 B2 | 2/2010 | Takano et al. | |
| 7,683,713 B2 | 3/2010 | Hongo | |
| 7,755,429 B2 | 7/2010 | Nguyen et al. | |
| 7,859,338 B2 | 12/2010 | Bajdechi et al. | |
| 7,889,820 B2 | 2/2011 | Murthy et al. | |
| 7,978,009 B2 | 7/2011 | Mu | |
| 8,605,819 B2 | 12/2013 | Lozhkin | |
| 8,649,745 B2 | 2/2014 | Bai et al. | |
| 8,749,309 B2 | 6/2014 | Ho et al. | |
| 8,831,544 B2 | 9/2014 | Walker et al. | |
| 8,884,692 B2 | 11/2014 | Lee | |
| 9,001,947 B2 | 4/2015 | Wyville | |
| 9,036,734 B1 | 5/2015 | Mauer et al. | |
| 9,065,504 B2 | 6/2015 | Kwon et al. | |
| 9,112,413 B2 | 8/2015 | Barth et al. | |
| 9,356,760 B2 | 5/2016 | Larsson et al. | |
| 9,438,196 B2 | 9/2016 | Smith et al. | |
| 9,461,596 B1 | 10/2016 | Ozard | |
| 9,560,595 B2 | 1/2017 | Dakshinamurthy et al. | |
| 9,692,366 B2 | 6/2017 | Pilgram | |
| 9,705,477 B2 | 7/2017 | Velazquez | |
| 9,973,370 B1 | 5/2018 | Langer et al. | |
| 10,177,719 B2 | 1/2019 | Gazneli et al. | |
| 10,305,435 B1 | 5/2019 | Murugesu et al. | |
| 10,326,408 B2 | 6/2019 | Khlat et al. | |
| 10,361,744 B1 | 7/2019 | Khlat | |
| 10,476,437 B2 | 11/2019 | Nag et al. | |
| 10,778,345 B2 | 9/2020 | El-Hassan et al. | |
| 11,005,368 B2 | 5/2021 | Bansal et al. | |
| 11,088,660 B2 | 8/2021 | Lin et al. | |
| 11,387,789 B2 | 7/2022 | Khlat et al. | |
| 11,424,719 B2 | 8/2022 | Khlat | |
| 11,483,186 B2 | 10/2022 | Casper et al. | |
| 11,569,783 B2 | 1/2023 | Nomiyama et al. | |
| 11,637,531 B1 | 4/2023 | Perreault et al. | |
| 2001/0054974 A1* | 12/2001 | Wright .................. | H03F 1/3247 341/144 |
| 2002/0190811 A1 | 12/2002 | Sperber | |
| 2003/0042979 A1* | 3/2003 | Gurvich ................ | H03F 1/3229 333/217 |
| 2004/0239446 A1* | 12/2004 | Gurvich ................ | H03F 1/3229 333/156 |
| 2005/0100105 A1 | 5/2005 | Jensen | |
| 2005/0254659 A1* | 11/2005 | Heinsen .................. | H04S 1/007 381/2 |
| 2006/0068710 A1* | 3/2006 | Jensen ............. | H04L 25/03343 455/63.1 |
| 2006/0209981 A1 | 9/2006 | Kluesing et al. | |
| 2006/0217083 A1 | 9/2006 | Braithwaite | |
| 2007/0032208 A1 | 2/2007 | Choi et al. | |
| 2008/0009258 A1* | 1/2008 | Safarian .................. | H04B 1/525 455/307 |
| 2008/0074209 A1 | 3/2008 | Ceylan et al. | |
| 2008/0161073 A1 | 7/2008 | Park et al. | |
| 2008/0246550 A1 | 10/2008 | Biedka et al. | |
| 2009/0004981 A1* | 1/2009 | Eliezer .................. | H03F 1/3247 455/127.1 |
| 2009/0061787 A1 | 3/2009 | Koller et al. | |
| 2009/0074106 A1 | 3/2009 | See et al. | |
| 2009/0125264 A1* | 5/2009 | Betts ...................... | G01R 27/28 702/85 |
| 2009/0141830 A1* | 6/2009 | Ye ....................... | H04L 27/3863 375/322 |
| 2009/0232260 A1* | 9/2009 | Hayashi ................ | H04B 1/525 375/346 |
| 2009/0302945 A1* | 12/2009 | Catoiu .................. | H03F 1/3282 330/252 |
| 2010/0135439 A1* | 6/2010 | Lackey .................. | H04B 1/525 375/344 |
| 2010/0298030 A1 | 11/2010 | Howard | |
| 2011/0095826 A1 | 4/2011 | Hadjichristos et al. | |
| 2011/0182347 A1 | 7/2011 | Cheung | |
| 2011/0227767 A1* | 9/2011 | O'Brien ........... | G01R 31/31935 341/118 |
| 2012/0068748 A1* | 3/2012 | Stojanovic .............. | H03L 7/091 327/161 |
| 2012/0139635 A1 | 6/2012 | Ho et al. | |
| 2012/0189081 A1 | 7/2012 | Omoto et al. | |
| 2012/0244824 A1* | 9/2012 | Entezari ................ | H03L 7/1806 455/114.2 |
| 2012/0256688 A1 | 10/2012 | Onishi | |
| 2013/0141062 A1 | 6/2013 | Khlat | |
| 2013/0214858 A1 | 8/2013 | Tournatory et al. | |
| 2013/0222057 A1 | 8/2013 | Henshaw | |
| 2013/0243129 A1* | 9/2013 | Okuni ..................... | H04L 27/38 375/322 |
| 2014/0028368 A1 | 1/2014 | Khlat | |
| 2014/0029683 A1 | 1/2014 | Morris et al. | |
| 2014/0055199 A1 | 2/2014 | Takano et al. | |
| 2014/0062590 A1 | 3/2014 | Khlat et al. | |
| 2014/0062599 A1 | 3/2014 | Xu et al. | |
| 2014/0065989 A1* | 3/2014 | McLaurin ............... | H03F 3/189 455/114.3 |
| 2014/0072307 A1* | 3/2014 | Zamani ................ | H04L 27/2647 398/79 |
| 2014/0084996 A1 | 3/2014 | Schwent et al. | |
| 2014/0105264 A1 | 4/2014 | McLaurin et al. | |
| 2014/0184337 A1 | 7/2014 | Nobbe et al. | |
| 2014/0213196 A1 | 7/2014 | Langer et al. | |
| 2014/0232470 A1 | 8/2014 | Wilson | |
| 2014/0266432 A1 | 9/2014 | Scott et al. | |
| 2014/0315504 A1 | 10/2014 | Sakai et al. | |
| 2014/0361837 A1 | 12/2014 | Strange et al. | |
| 2015/0028946 A1 | 1/2015 | Al-Qaq et al. | |
| 2015/0126142 A1* | 5/2015 | Meredith ............... | H04W 52/04 455/127.2 |
| 2015/0333781 A1 | 11/2015 | Alon et al. | |
| 2016/0173030 A1 | 6/2016 | Langer et al. | |
| 2016/0174293 A1 | 6/2016 | Mow et al. | |
| 2016/0182099 A1 | 6/2016 | Boddupally et al. | |
| 2016/0182100 A1 | 6/2016 | Menkhoff et al. | |
| 2016/0301432 A1 | 10/2016 | Shizawa et al. | |
| 2016/0322992 A1* | 11/2016 | Okawa .................... | H03F 1/34 |
| 2017/0005676 A1 | 1/2017 | Yan et al. | |
| 2017/0104502 A1 | 4/2017 | Pratt | |
| 2017/0149457 A1* | 5/2017 | Mayer ................... | H04L 1/0042 |
| 2017/0170838 A1* | 6/2017 | Pagnanelli ............... | H04L 7/005 |
| 2017/0338842 A1 | 11/2017 | Pratt | |
| 2017/0353197 A1* | 12/2017 | Ruffieux ................. | H03K 7/02 |
| 2018/0034418 A1* | 2/2018 | Blednov ................. | H03F 3/195 |
| 2018/0175813 A1 | 6/2018 | Scott et al. | |
| 2018/0226923 A1* | 8/2018 | Nagamori ................ | H03F 3/245 |
| 2018/0248570 A1 | 8/2018 | Camuffo | |
| 2019/0041890 A1 | 2/2019 | Chen et al. | |
| 2019/0058530 A1* | 2/2019 | Rainish ................ | H04B 7/0617 |
| 2019/0068234 A1 | 2/2019 | Khlat et al. | |
| 2019/0238152 A1* | 8/2019 | Pagnanelli ............... | H03M 3/51 |
| 2019/0245496 A1 | 8/2019 | Khlat et al. | |
| 2019/0296929 A1 | 9/2019 | Milicevic et al. | |
| 2019/0319583 A1 | 10/2019 | El-Hassan et al. | |
| 2019/0356285 A1 | 11/2019 | Khlat et al. | |
| 2020/0106392 A1 | 4/2020 | Khlat et al. | |
| 2020/0119699 A1 | 4/2020 | Nishihara et al. | |

(56) References Cited

U.S. PATENT DOCUMENTS

| | | |
|---|---|---|
| 2020/0136563 A1 | 4/2020 | Khlat |
| 2020/0136568 A1 | 4/2020 | Hosoda et al. |
| 2020/0162030 A1 | 5/2020 | Drogi et al. |
| 2020/0204422 A1 | 6/2020 | Khlat |
| 2020/0259685 A1 | 8/2020 | Khlat |
| 2020/0295713 A1 | 9/2020 | Khlat |
| 2020/0336111 A1 | 10/2020 | Khlat |
| 2021/0058970 A1 | 2/2021 | Kwak et al. |
| 2021/0067097 A1 | 3/2021 | Wang et al. |
| 2021/0099136 A1 | 4/2021 | Drogi et al. |
| 2021/0143859 A1 | 5/2021 | Hageraats et al. |
| 2021/0194517 A1 | 6/2021 | Mirea et al. |
| 2021/0194740 A1 | 6/2021 | Aldana et al. |
| 2021/0281228 A1 | 9/2021 | Khlat |
| 2021/0399690 A1 | 12/2021 | Panseri et al. |
| 2022/0021348 A1 | 1/2022 | Philpott et al. |
| 2022/0216834 A1 | 7/2022 | Myoung et al. |
| 2022/0360229 A1 | 11/2022 | Khlat |
| 2022/0407462 A1 | 12/2022 | Khlat |
| 2022/0407463 A1 | 12/2022 | Khlat et al. |
| 2022/0407464 A1 | 12/2022 | Khlat et al. |
| 2022/0407465 A1 | 12/2022 | Khlat |
| 2022/0407478 A1 | 12/2022 | Khlat et al. |
| 2022/0416730 A1 | 12/2022 | Su et al. |
| 2023/0065760 A1* | 3/2023 | Hellberg ............... H03F 3/604 |
| 2023/0080621 A1 | 3/2023 | Khlat |
| 2023/0080652 A1 | 3/2023 | Khlat et al. |
| 2023/0081095 A1 | 3/2023 | Khlat |
| 2023/0082145 A1 | 3/2023 | Lin et al. |
| 2023/0155614 A1* | 5/2023 | Jelonnek ............... H03F 3/189 |
| | | 455/114.2 |
| 2023/0238927 A1 | 7/2023 | Kay et al. |
| 2023/0387859 A1 | 11/2023 | Drogi et al. |
| 2024/0372665 A1 | 11/2024 | Khoryaev et al. |
| 2024/0426954 A1 | 12/2024 | Guan et al. |

FOREIGN PATENT DOCUMENTS

| | | |
|---|---|---|
| CN | 1550064 A | 11/2004 |
| CN | 1706096 A | 12/2005 |
| CN | 1326321 C | 7/2007 |
| CN | 101036289 A | 9/2007 |
| CN | 101651459 A | 2/2010 |
| CN | 105812073 A | 7/2016 |
| CN | 107483021 A | 12/2017 |
| CN | 110798155 A | 2/2020 |
| CN | 110855251 A | 2/2020 |
| CN | 111064438 A | 4/2020 |
| CN | 210693998 U | 6/2020 |
| CN | 112995079 A | 6/2021 |
| CN | 113055324 A | 6/2021 |
| CN | 113659938 A | 11/2021 |
| CN | 113055324 B | 12/2021 |
| CN | 116015223 A | 4/2023 |
| CN | 113659938 B | 5/2023 |
| CN | 116794580 A | 9/2023 |
| CN | 118117977 A | 5/2024 |
| CN | 118117977 B | 11/2024 |
| EP | 2705604 A2 | 3/2014 |
| EP | 2582041 B1 | 4/2018 |
| EP | 2232713 B1 | 10/2018 |
| EP | 3416340 A1 | 12/2018 |
| JP | 2011211533 A | 10/2011 |
| JP | 2015099972 A | 5/2015 |
| WO | WO-2007092794 A2 * | 8/2007 ........... H03F 1/0205 |
| WO | 2010011551 A2 | 1/2010 |
| WO | 2010135711 A1 | 11/2010 |
| WO | 2014026178 A1 | 2/2014 |
| WO | 2021042088 A2 | 3/2021 |
| WO | 2023150539 A1 | 8/2023 |
| WO | 2023150545 A1 | 8/2023 |
| WO | 2023150587 A1 | 8/2023 |

OTHER PUBLICATIONS

Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Notice of Allowance for U.S. Appl. No. 17/700,685, mailed Apr. 5, 2024, 7 pages.
Final Office Action for U.S. Appl. No. 17/689,232, mailed Mar. 26, 2024, 28 pages.
Supplemental Notice of Allowability for U.S. Appl. No. 17/700,700, mailed Feb. 28, 2024, 5 pages.
Advisory Action U.S. Appl. No. 17/689,232, mailed May 23, 2024, 3 pages.
Non-Final Office Action for U.S. Appl. No. 17/689,232, mailed Jul. 17, 2024, 22 pages.
Non-Final Office Action for U.S. Appl. No. 17/700,826, mailed May 15, 2024, 28 pages.
International Search Report and Written Opinion for International Patent Application No. PCT/US2023/061734, mailed May 30, 2023, 15 pages.
International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
Final Office Action for U.S. Appl. No. 17/939,350, mailed May 21, 2024, 11 pages.
Final Office Action for U.S. Appl. No. 17/942,472, mailed Jul. 19, 2023, 16 pages.
Advisory Action for U.S. Appl. No. 17/942,472, mailed Sep. 15, 2023, 3 pages.
Notice of Allowance for U.S. Appl. No. 17/942,472, mailed Oct. 18, 2023, 10 pages.
International Search Report and Written Opinion for International Patent Application No. PCT/US2023/019267, mailed Aug. 3, 2023, 14 pages.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.
International Search Report and Written Opinion for International Patent Application No. PCT/US2023/060303, mailed Apr. 11, 2023, 12 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.

(56) References Cited

OTHER PUBLICATIONS

Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.
Non-Final Office Action for U.S. Appl. No. 17/737,300, mailed Aug. 28, 2023, 14 pages.
Extended European Search Report for European Patent Application No. 23153108.8, mailed Jun. 20, 2023, 18 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
U.S. Appl. No. 17/700,685, filed Mar. 22, 2022.
U.S. Appl. No. 17/689,232, filed Mar. 8, 2022.
U.S. Appl. No. 17/714,244, filed Apr. 6, 2022.
U.S. Appl. No. 17/737,300, filed May 5, 2022.
U.S. Appl. No. 17/942,472, filed Sep. 12, 2022.
U.S. Appl. No. 17/700,700, filed Mar. 22, 2022.
U.S. Appl. No. 17/939,350, filed Sep. 7, 2022.
U.S. Appl. No. 17/700,826, filed Mar. 22, 2022.
U.S. Appl. No. 17/939,372, filed Sep. 7, 2022.
Williams, P., "Crossover Filter Shape Comparisons," White Paper, Linea Research, Jul. 2013, 13 pages.
Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.
Hammi et al., "Temperature Compensated Digital Predistorter for 3G Power Amplifiers," Electronics, Circuit and Systems, 2005, Dec. 11, 2005, pp. 1-4.
Hao et al., "Hybrid Analog/Digital Linearization Based on Dual-Domain Decomposition of Nonlinearity," 2019 IEEE Asia-Pacific Microwave Conference, Dec. 10, 2019, pp. 156-158.
Lee et al., "Fully Automated Adaptive Analog Predistortion Power Amplifier in WCDMA Applications," 2005 European Microwave Conference CNIT La Defense, Paris, France, vol. 2, Oct. 4, 2005, pp. 967-970.
Li et al., "Analog Predistorter Averaged Digital Predistortion for Power Amplifiers in Hybrid Beam-Forming Multi-Input Multi-Output Transmitter," IEEE Access, vol. 8, Aug. 1, 2020, pp. 146145-146153.
Tome et al., "Hybrid Analog/Digital Linearizatio nof GaN HEMT-Based Power Amplifiers," IEEE Transactions on Microwave Theory and Techniques, vol. 67, No. 1, Jan. 1, 2019, pp. 288-294.
Notice of Allowance for U.S. Appl. No. 17/689,232, mailed Oct. 21, 2024, 10 pages.
Notice of Allowance for U.S. Appl. No. 17/714,244, mailed Sep. 16, 2024, 8 pages.
Non-Final Office Action for U.S. Appl. No. 17/939,350, mailed Sep. 6, 2024, 8 pages.
Notice of Allowance and Examiner-Initiated Interview Summary for U.S. Appl. No. 17/700,826, mailed Sep. 11, 2024, 10 pages.
International Search Report and Written Opinion for International Patent Application No. PCT/US2023/060803, mailed May 19, 2023, 13 pages.
International Search Report and Written Opinion for International Patent Application No. PCT/US2023/060804, mailed May 4, 2023, 19 pages.
International Search Report and Written Opinion for International Patent Application No. PCT/US2023/025512, mailed Sep. 28, 2023, 13 pages.
Fu, J.-S. et al., "Improving Power Amplifier Efficiency and Linearity Using a Dynamically Controlled Tunable Matching Network," IEEE Transactions on Microwave Theory and Techniques, vol. 56, No. 12, Dec. 2008, pp. 3239-3244.
Kim, S. et al., "A Tunable Power Amplifier Employing Digitally Controlled Accumulation-mode Varactor Array for 2.4-GHz Short-range Wireless Communication," 2016 IEEE Asia Pacific Conference on Circuits and Systems (APCCAS), Oct. 25-28, 2016, Jeju, Korea (South), IEEE, pp. 269-272.
Wang, T.-P., "A Fully Integrated W-Band Push-Push CMOS VCO With Low Phase Noise and Wide Tuning Range,". IEEE Transactions on Ultrasonics, Ferroelectrics, and Frequency Control, vol. 58, No. 7, Jul. 2011, IEEE, pp. 1307-1319.
Wanner, R. et al., "Monolithically Integrated SiGe Push-Push Oscillators in the Frequency Range 50-190 GHZ," 2006 IEEE Ninth International Symposium on Spread Spectrum Techniques and Applications, Aug. 28-31, 2006, Manaus, Brazil, IEEE, pp. 26-30.

* cited by examiner

AMPLITUDE-TO-PHASE ERROR CORRECTION IN A TRANSCEIVER CIRCUIT

RELATED APPLICATIONS

This application claims the benefit of provisional patent application Ser. No. 63/245,151, filed Sep. 16, 2021, the disclosure of which is hereby incorporated herein by reference in its entirety.

FIELD OF THE DISCLOSURE

The technology of the disclosure relates generally to a transceiver circuit and a related transmission circuit incorporating the transceiver circuit.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on a higher data rate offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to higher power before transmission.

In a typical transmission circuit, a transceiver circuit is configured to generate an RF signal, a power management circuit is configured to generate a modulated voltage, a power amplifier circuit is configured to amplify the RF signal based on the modulated voltage, and an antenna circuit is configured to transmit the RF signal in one or more transmission frequencies. The power amplifier circuit can be further coupled to the antenna circuit via an RF frontend circuit (e.g., filter, switches, etc.). Notably, an output reflection coefficient (e.g., $S_{22}$) of the power amplifier circuit can interact with an input reflection coefficient (e.g., $S_{11}$) of the RF front-end circuit to cause a group delay in the RF signal to potentially create an amplitude-to-phase (AM-PM) distortion in the RF signal. As such, it is desirable to correct the AM-PM distortion in the RF signal in all of the transmission frequencies to help prevent undesired amplitude distortion and/or spectrum regrowth, particularly when the RF signal is modulated across a wide modulation bandwidth (e.g., ≥200 MHZ).

SUMMARY

Embodiments of the disclosure relate to amplitude-to-phase (AM-PM) error correction in a transceiver circuit. The transceiver circuit is configured to generate a radio frequency (RF) signal from a time-variant input vector for transmission in one or more transmission frequencies. In embodiments disclosed herein, the transceiver circuit is configured to determine a phase correction term from the time-variant input vector and apply the determined phase correction term to the time-variant input vector to thereby correct an AM-PM error(s) in the RF signal. By correcting the AM-PM error(s) in the transceiver circuit, it is possible to prevent undesired amplitude distortion and/or spectrum regrowth in any of the transmission frequencies, particularly when the RF signal is modulated across a wide modulation bandwidth (e.g., ≥200 MHz).

In one aspect, a transceiver circuit is provided. The transceiver circuit includes a delay equalizer circuit. The delay equalizer circuit is configured to receive a time-variant input vector having a time-variant amplitude and associated with a variable group delay that varies in accordance with the time-variant amplitude. The delay equalizer circuit is also configured to equalize the time-variant input vector based on a first complex filter to thereby convert the variable group delay into a constant group delay across the time-variant amplitude. The delay equalizer circuit is also configured to generate a delay-equalized vector associated with the time-variant amplitude and having the constant group delay across the time-variant amplitude. The transceiver circuit also includes a phase correction circuit. The phase correction circuit is configured to determine, based on the delay-equalized vector, a phase correction term configured to correct a phase error caused by the constant group delay. The phase correction circuit is also configured to apply the determined phase correction term to the delay-equalized vector to generate a delay-phase-equalized vector.

In another aspect, a transmission circuit is provided. The transmission circuit includes a power amplifier circuit. The power amplifier circuit is configured to amplify an RF signal based on a modulated voltage for transmission in a plurality of transmission frequencies. The transmission circuit also includes a transceiver circuit. The transceiver circuit includes a digital processing circuit. The digital processing circuit is configured to generate a time-variant input vector having a time-variant amplitude. The transceiver circuit also includes a delay equalizer circuit. The delay equalizer circuit is configured to receive the time-variant input vector having the time-variant amplitude and associated with a variable group delay that varies in accordance with the time-variant amplitude. The delay equalizer circuit is also configured to equalize the time-variant input vector based on a first complex filter to thereby convert the variable group delay into a constant group delay across the time-variant amplitude. The delay equalizer circuit is also configured to generate a delay-equalized vector associated with the time-variant amplitude and having the constant group delay across the time-variant amplitude. The transceiver circuit also includes a phase correction circuit configured to determine, based on the delay-equalized vector, a phase correction term configured to correct a phase error caused by the constant group delay. The phase correction circuit is also configured to apply the determined phase correction term to the delay-equalized vector to generate a delay-phase-equalized vector. The transceiver circuit also includes a signal conversion circuit. The signal conversion circuit is configured to generate the RF signal based on the delay-phase-equalized vector.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to amplitude-to-phase (AM-PM) error correction in a transceiver circuit. The transceiver circuit is configured to generate a radio frequency (RF) signal from a time-variant input vector for transmission in one or more transmission frequencies. In embodiments disclosed herein, the transceiver circuit is configured to determine a phase correction term from the time-variant input vector and apply the determined phase correction term to the time-variant input vector to thereby correct an AM-PM error(s) in the RF signal. By correcting the AM-PM error(s) in the transceiver circuit, it is possible to prevent undesired amplitude distortion and/or spectrum regrowth in any of the transmission frequencies, particularly when the RF signal is modulated across a wide modulation bandwidth (e.g., ≥200 MHZ).

Figure 1A:
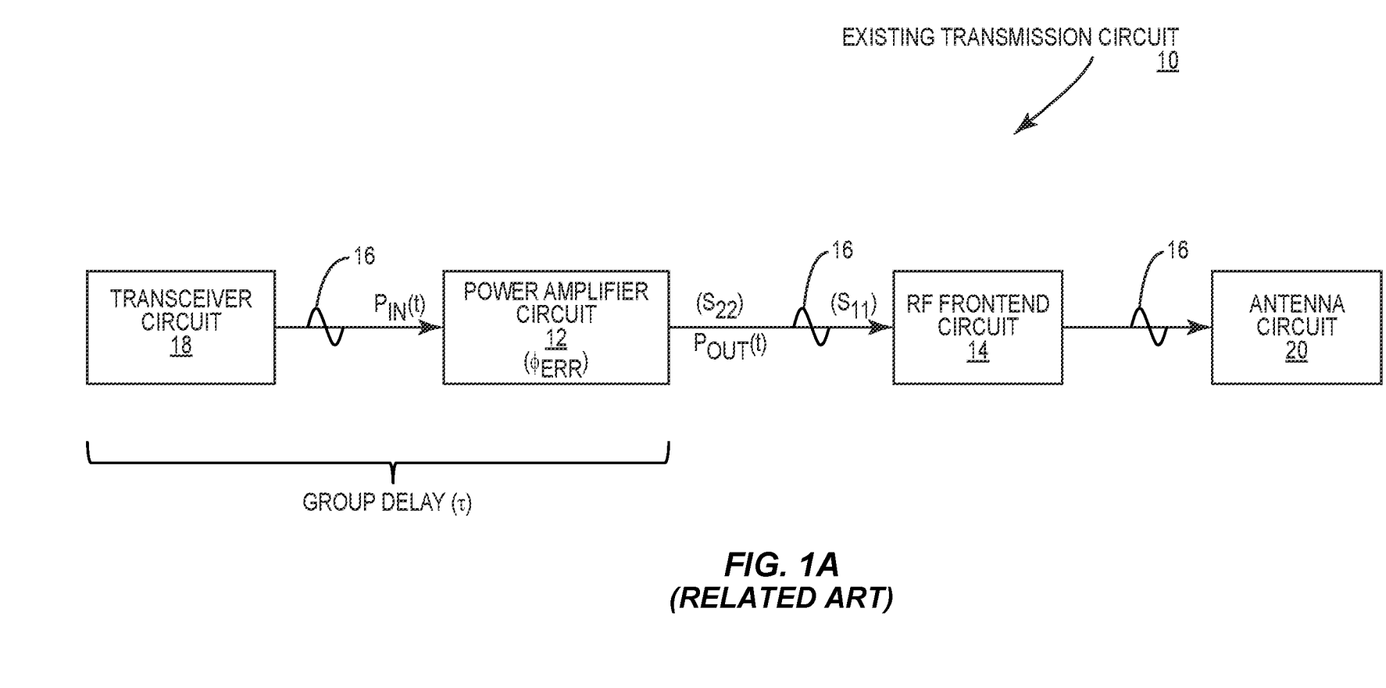
FIG. 1A is a schematic diagram of an exemplary existing transmission circuit wherein a group delay caused by interactions between a power amplifier circuit and a radio frequency (RF) frontend circuit can create an amplitude-to-phase (AM-PM) error in an RF signal.
Figure 1B:
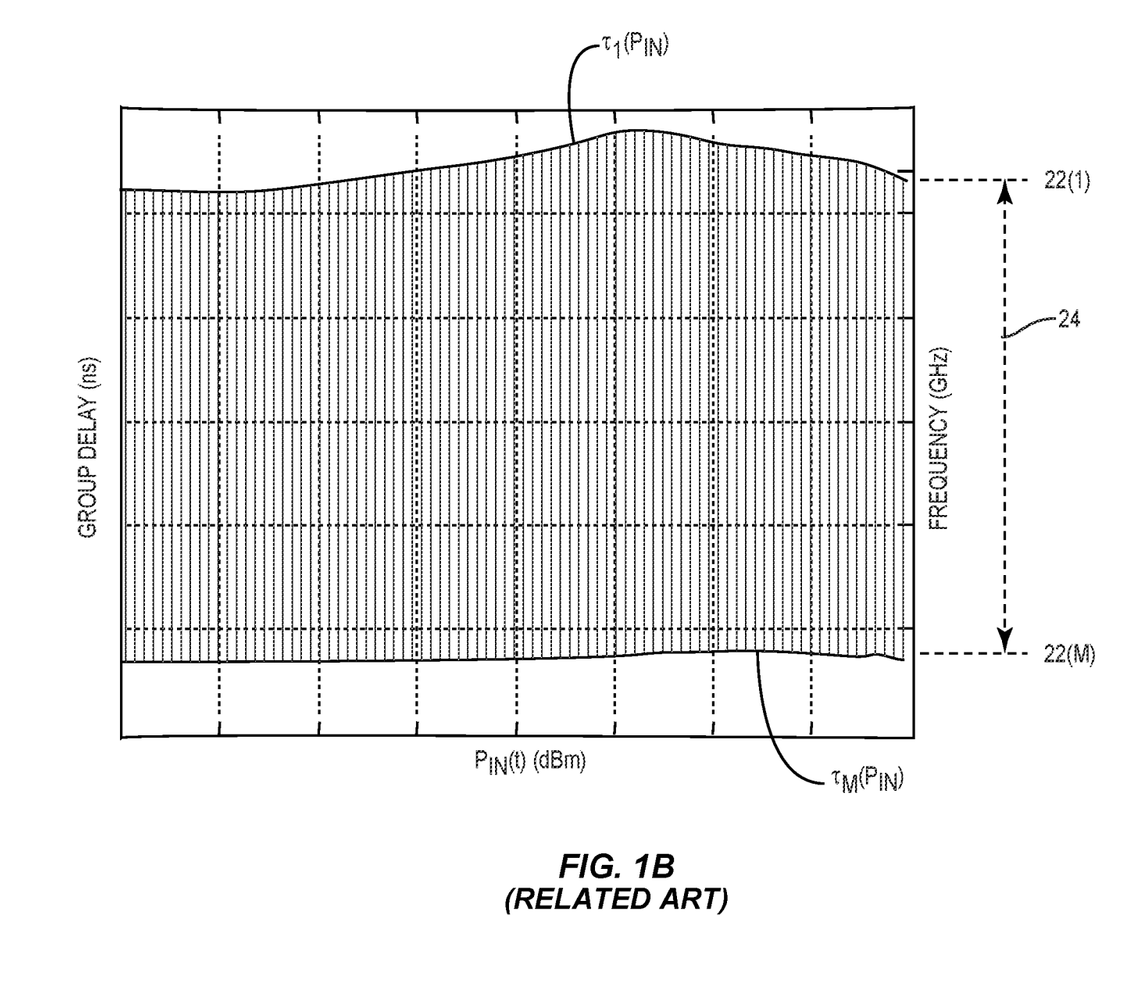
FIG. 1B is a graphic diagram illustrating a distribution of multiple group delays across multiple transmission frequencies.
Figure 1C:
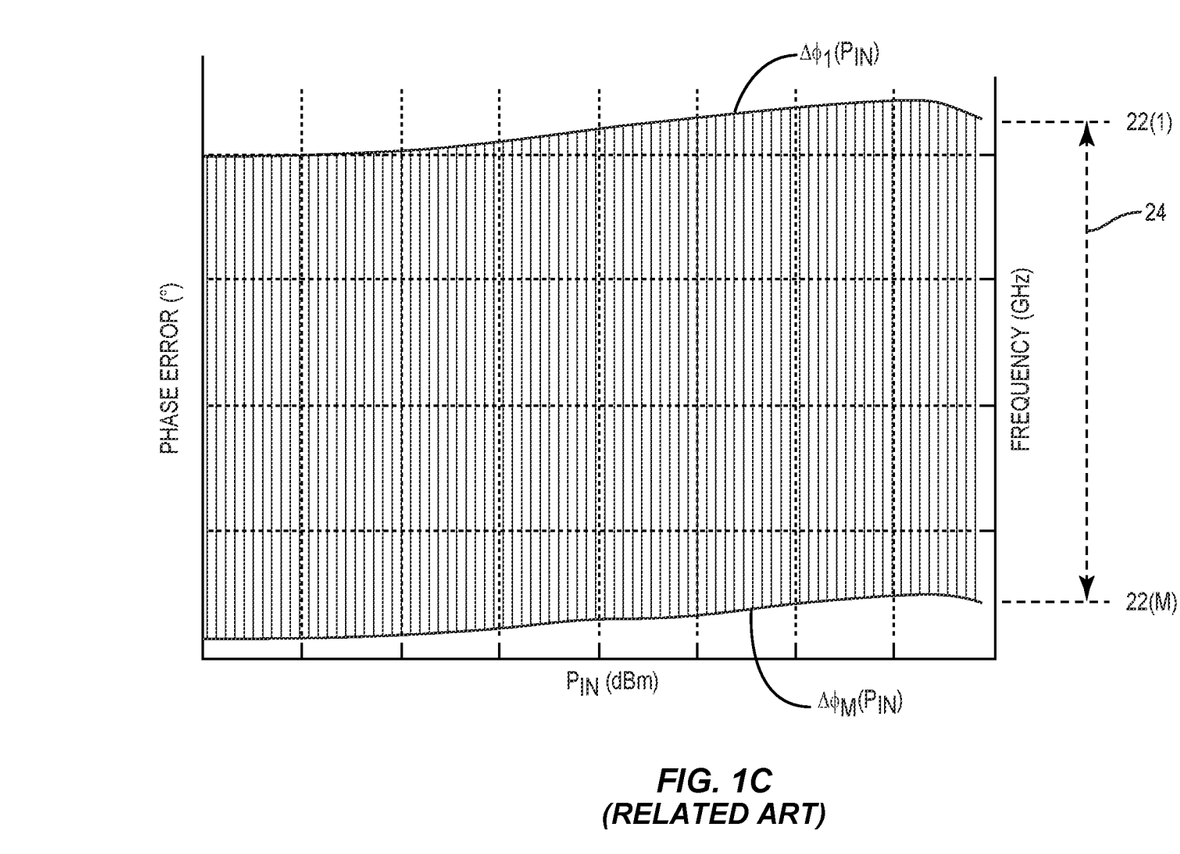
FIG. 1C is a graphic diagram illustrating a distribution of multiple variable phase errors across the multiple transmission frequencies in FIG. 1B.
Figure 2:
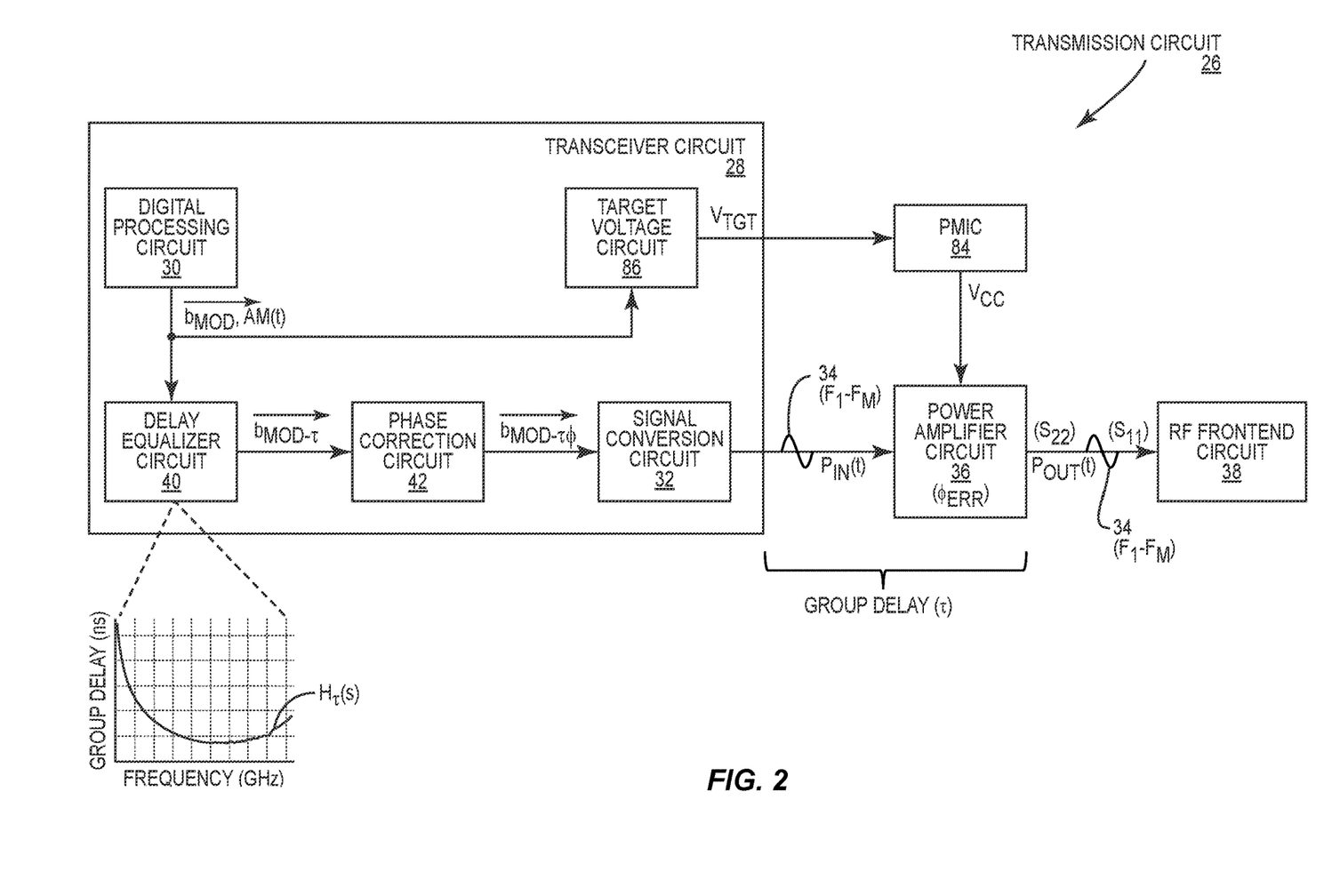
FIG. 2 is a schematic diagram of an exemplary transmission circuit wherein a transceiver circuit can be configured according to various embodiments of the present disclosure to correct the AM-PM error in FIG. 1A.

Before discussing the transceiver circuit according to the present disclosure, starting at FIG. 2, a brief discussion of an existing transmission circuit is first provided with reference to FIGS. 1A to 1C to help understand how an unwanted group delay can cause an AM-PM error(s) across transmission frequencies of an RF signal.

FIG. 1A is a schematic diagram of an exemplary existing transmission circuit 10 wherein a group delay t caused by interactions between a power amplifier circuit 12 and an RF frontend circuit 14 can cause an AM-PM error ØERR in an RF signal 16. The existing transmission circuit also includes a transceiver circuit 18 and an antenna circuit 20. The transceiver circuit 18 is configured to generate the RF signal 16 associated with a time-variant input power $P_{IN}(t)$ and provide the RF signal 16 to the power amplifier circuit 12. The power amplifier circuit 12 is configured to amplify the RF signal 16 to a time-variant output power $P_{OUT}(t)$ and provide the amplified RF signal 16 to the RF frontend circuit 14. The RF frontend circuit 14, which may include such analog circuits as filters, switches, and so on (not shown), is configured to provide the amplified RF signal 16 to the antenna circuit 20 for emission in one or more transmission frequencies.

Notably, when the power amplifier circuit 12 is coupled to the RF front-end circuit 14, an output reflection coefficient (e.g., $S_{22}$) of the power amplifier circuit 12 can interact with an input reflection coefficient (e.g., $S_{11}$) of the RF front-end circuit 14 to create the group delay $\tau$ in the RF signal 16. The group delay $\tau$, which can be expressed in equation (Eq. 1) below, can cause a phase error $\Delta\phi$ at the power amplifier circuit 12 to thereby create the AM-PM error $\phi$ERR in the RF signal 16.

$$\tau = -\Delta\phi/\Delta t \qquad \text{(Eq. 1)}$$

Studies have shown that the group delay $\tau$ in each of the transmission frequencies varies in accordance with the time-variant input power $P_{IN}(t)$ or the time-variant output power $P_{OUT}(t)$, as illustrated in FIG. 1B. FIG. 1B is a graphic diagram illustrating a distribution of the group delay $\tau$ across multiple transmission frequencies 22(1)-22(M) within a modulation bandwidth 24 of the RF signal in FIG. 1A. As shown in FIG. 1B, each of the transmission frequencies 22(1)-22(M) is associated with a respective one of multiple variable group delays $\tau_1(P_{IN})$-$\tau_M(P_{IN})$, and each varies in accordance with the time-variant input power $P_{IN}(t)$.

Given the relationship between the group delay $\tau$ and the phase error $\Delta\phi$ in equation (Eq. 1), the phase error $\Delta\phi$ associated with each of the variable group delays $\tau_1(P_{IN})$-$\tau_M(P_{IN})$ will also vary according to the time-variant input power $P_{IN}(t)$. FIG. 1C is a graphic diagram illustrating a distribution of the variable phase errors $\Delta\phi_1(P_{IN})$-$\Delta\phi_M(P_{IN})$ across the transmission frequencies 22(1)-22(M) of the RF signal 16 in FIG. 1A. As shown in FIG. 1C, each of the transmission frequencies 22(1)-22(M) is associated with a respective one of multiple variable phase errors $\Delta\phi_1(P_{IN})$-$\Delta\phi_M(P_{IN})$. Moreover, for any given level of the time-variant input power $P_{IN}(t)$, each of the variable phase errors $\Delta\phi_1(P_{IN})$-$\Delta\phi_M(P_{IN})$ associated with a respective one of the transmission frequencies 22(1)-22(M) is nonlinear relative to any other variable phase errors $\Delta\phi_1(P_{IN})$-$\Delta\phi_M(P_{IN})$ associated with any other transmission frequencies 22(1)-22(M). For example, the variable phase errors $\Delta\phi_1(P_{IN})$ associated with the transmission frequency 22(1) is nonlinearly related to the variable phase errors $\Delta\phi_M(P_{IN})$ associated with the transmission frequency 22(M) for any given value of the time-variant input power $P_{IN}(t)$.

The variable phase errors $\Delta\phi_1(P_{IN})$-$\Delta\phi_M(P_{IN})$ can cause the AM-PM error DERR in the RF signal 16, which can lead to undesired amplitude distortion and/or spectrum regrowth within the modulation bandwidth 24 of the RF signal 16. As such, it is necessary to correct variable phase errors $\Delta\phi_1(P_{IN})$-$\Delta\phi_M(P_{IN})$ across the transmission frequencies 22(1)-22(M).

With reference back to FIG. 1A, the existing transmission circuit 10 is typically configured to correct the time-variant phase errors $\Delta\phi_1$-$\Delta\phi_M$ individually. For example, the transceiver circuit 18 can be configured to store multiple sets of predetermined complex coefficients and correct each of the time-variant phase errors $\Delta\phi_1$-$\Delta\phi_M$ based on a respective one of the multiple sets of predetermined complex coefficients. Understandably, such a conventional approach may require more computational resources in the transceiver circuit 18 and lead to a suboptimal efficiency.

FIG. 2 is a schematic diagram of an exemplary transmission circuit 26 wherein a transceiver circuit 28 can be configured according to various embodiments of the present disclosure to correct the AM-PM error ØERR caused by the variable phase errors $\Delta\phi_1(P_{IN})$-$\Delta\phi_M(P_{IN})$ in the existing transmission circuit 10 of FIG. 1A. Herein, the transceiver circuit 28 includes a digital processing circuit 30 and a signal conversion circuit 32. The digital processing circuit 30, which can be a digital baseband circuit as an example, is configured to generate a time-variant input vector $\vec{b}_{MOD}$ associated with a time-variant amplitude AM(t). The signal conversion circuit 32, which may include a digital-to-analog converter (DAC) (not shown), is configured to generate an RF signal 34 having a time-variant input power $P_{IN}(t)$ from the time-variant input vector $\vec{b}_{MOD}$. Understandably, the time-variant input power $P_{IN}(t)$ of the RF signal 34 closely resembles the time-variant amplitude AM(t) of the time-variant input vector $\vec{b}_{MOD}$. The signal conversion circuit 32 may further include a frequency converter and/or filter (not shown) for converting the RF signal 34 into one of multiple transmission frequencies $F_1$-$F_M$ (a.k.a. RF frequencies) within a modulation bandwidth of the transceiver circuit 28.

The signal conversion circuit 32 is coupled to a power amplifier circuit 36 and configured to provide the RF signal 34 to the power amplifier circuit 36. The power amplifier circuit 36, which is a separate circuit from the transceiver circuit 28, is configured to amplify the RF signal 34 from the time-variant input power $P_{IN}(t)$ to a time-variant output power $P_{OUT}(t)$.

Similar to the power amplifier circuit 12 in the existing transmission circuit 10, the power amplifier circuit 36 can be coupled to an antenna circuit (not shown) via an RF frontend circuit 38. Like the existing transmission circuit 10, an output reflection coefficient (e.g., $S_{22}$) of the power amplifier circuit 36 can interact with an input reflection coefficient (e.g., $S_{11}$) of the RF frontend circuit 38 to create the group delay $\tau$ in the RF signal 34. Understandably, the group delay $\tau$ can exhibit a similar transmission frequency and input power dependency as shown in FIG. 1B. In other words, each of the transmission frequencies $F_1$-$F_M$ is associated with a respective one of multiple variable group delays $\tau_1(P_{IN})$-$\tau_M(P_{IN})$. Also, the variable group delays $\tau_1(P_{IN})$-$\tau_M(P_{IN})$ can cause multiple variable phase errors $\Delta\phi_1(P_{IN})$-$\Delta\phi_M(P_{IN})$, which exhibit a similar nonlinear relationship between the transmission frequencies $F_1$-$F_M$, as illustrated in FIG. 1C.

Herein, the transceiver circuit 28 is configured according to embodiments of the present disclosure to correct the variable phase errors $\Delta\phi_1(P_{IN})$-$\Delta\phi_M(P_{IN})$ associated with the variable group delays $\tau_1(P_{IN})$-$\tau_M(P_{IN})$ to thereby correct the AM-PM error $\phi_{ERR}$ in the RF signal 34. In this regard, the transceiver circuit is further configured to include a delay equalizer circuit 40 and a phase correction circuit 42.

Figure 3A:
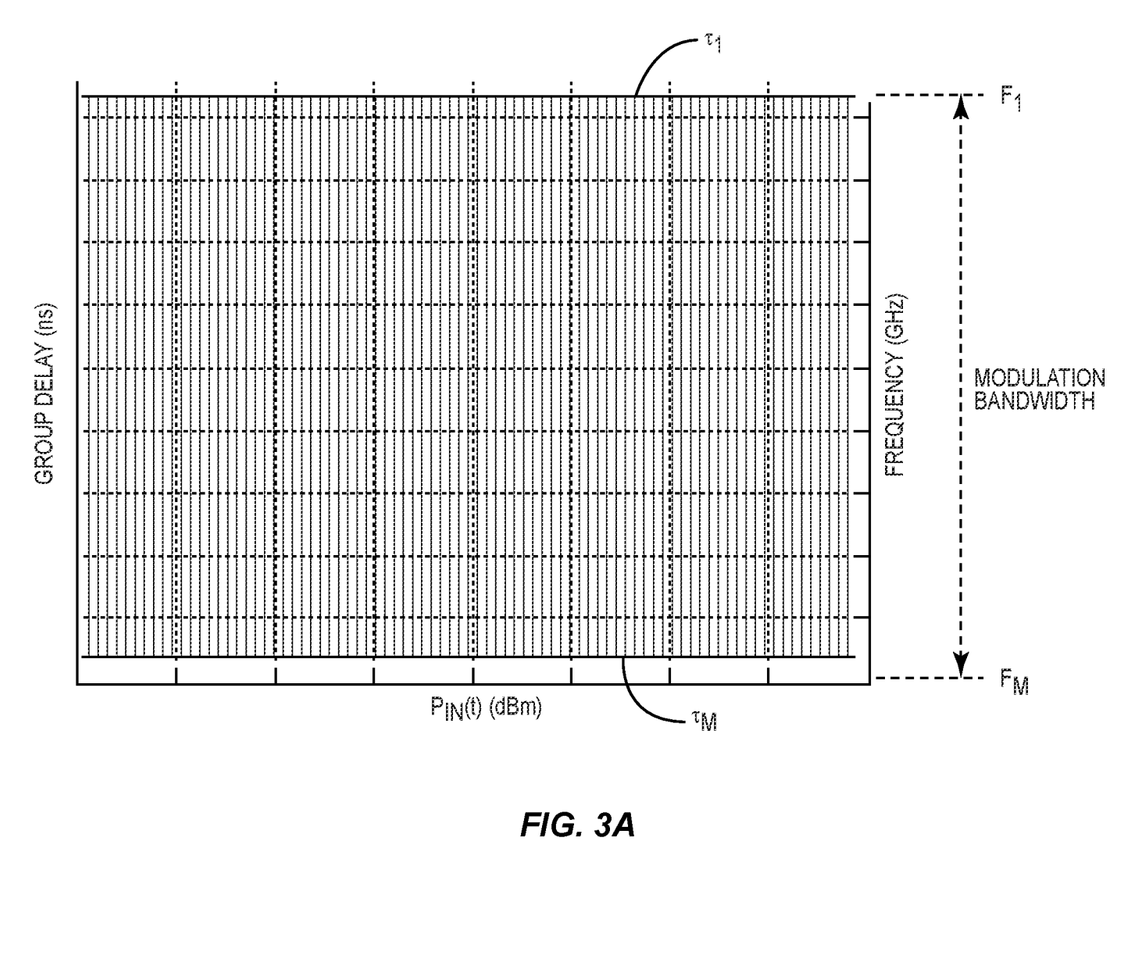
FIG. 3A is a graphic diagram illustrating a distribution of multiple constant group delays across multiple transmission frequencies.

The delay equalizer circuit 40 is configured to apply a first complex filter $H_\tau(s)$ to the time-variant input vector $\vec{b}_{MOD}$ to convert each of the variable group delays $\tau_1(P_{IN})$-$\tau_M(P_{IN})$ into a respective one of multiple constant group delays $\tau_1$-$\tau_M$, as illustrated in FIG. 3A. FIG. 3A is a graphic diagram illustrating a distribution of the constant group delays $\tau_1$-$\tau_M$ across the transmission frequencies $F_1$-$F_M$. As shown in FIG. 3A, for each of the transmission frequencies $F_1$-$F_M$, the respective one of the group delays $\tau_1$-$\tau_M$ stays constant relative to the time-variant input power $P_{IN}(t)$.

Figure 3B:
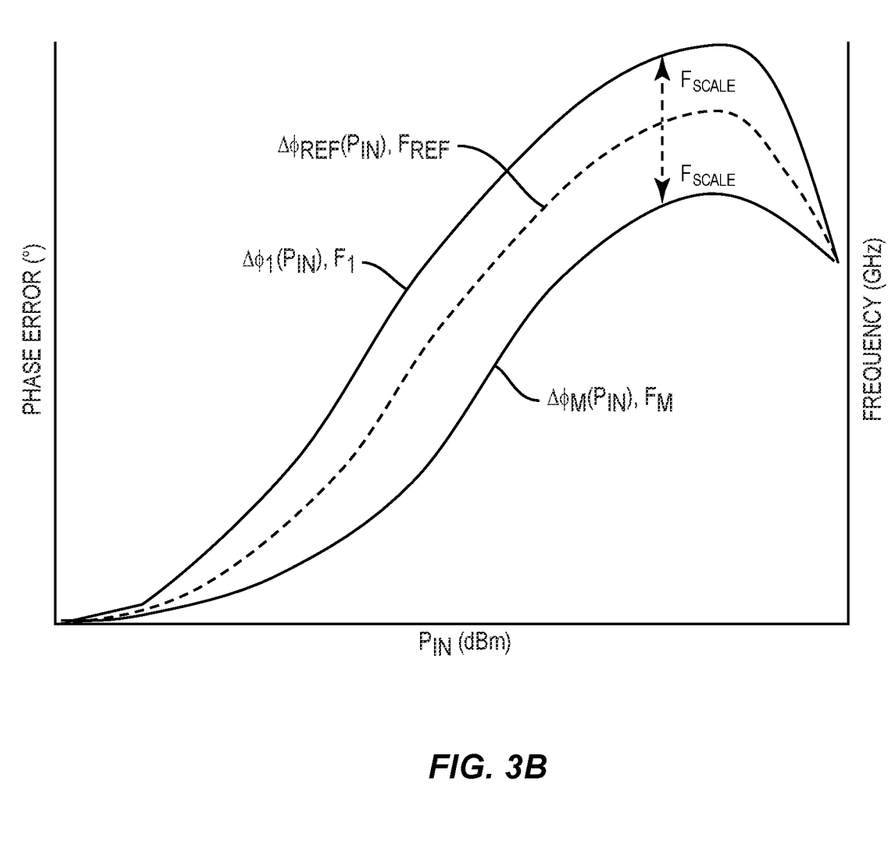
FIG. 3B is a graphic diagram illustrating a distribution of multiple linearly related variable phase errors across the multiple transmission frequencies in FIG. 3A.

Given the constant group delays $\tau_1$-$\tau_M$ and the $\tau$-$\Delta\phi$ relationship established in equation (Eq. 1), the variable phase errors $\Delta\phi_1(P_{IN})$-$\Delta\phi_M(P_{IN})$ will in turn exhibit a linear relationship across the transmission frequencies $F_1$-$F_M$, as illustrated in FIG. 3B.

FIG. 3B is a graphic diagram illustrating a distribution of the variable phase errors $\Delta\phi_1(P_{IN})$-$\Delta\phi_M(P_{IN})$ across the transmission frequencies $F_1$-$F_M$. Given the linear relationship between the variable phase errors $\Delta\phi_1(P_{IN})$-$\Delta\phi_M(P_{IN})$, each of the variable phase errors $\Delta\phi_1(P_{IN})$-$\Delta\phi_M(P_{IN})$ can be moved up or down based on an appropriate scaling factor $F_{SCALE}$ to superimpose on another one of the variable phase errors $\Delta\phi_1(P_{IN})$-$\Delta\phi_M(P_{IN})$. For example, the variable phase errors $\Delta\phi_1(P_{IN})$ associated with the transmission frequency $F_1$ can be moved downward to superimpose on the variable phase errors $\Delta\phi_M(P_{IN})$ associated with the transmission frequency $F_M$. Likewise, the variable phase errors $\Delta\phi_M(P_{IN})$ associated with the transmission frequency $F_M$ can be moved upward to superimpose on the variable phase errors $\Delta\phi_1(P_{IN})$ associated with the transmission frequency $F_1$.

The linearity and scalability characteristics of variable phase errors $\Delta\phi_1(P_{IN})$-$\Delta\phi_M(P_{IN})$ across the transmission frequencies $F_1$-$F_M$, as illustrated in FIG. 3B, can thus be explored to help reduce complexity associated with AM-PM error reduction. In an embodiment, a variable reference phase error $\Delta\phi_{REF}(P_{IN})$ associated with a reference frequency $F_{REF}$ is defined as a benchmark. The reference frequency $F_{REF}$ may be any one of the transmission frequencies $F_1$-$F_M$, a center frequency of the modulation bandwidth of the RF signal 34, or even an arbitrary frequency, as long as the scaling factors $F_{SCALE}$ for superimposing the variable reference phase error $\Delta\phi_{REF}(P_{IN})$ on any of the variable phase errors $\Delta\phi_1(P_{IN})$-$\Delta\phi_M(P_{IN})$ are determined appropriately. Thus, contrary to correcting the time-variant phase errors $\Delta 01$-$\Delta\phi_M$ individually as the existing transmission circuit 10 does, the transceiver circuit 28 will instead perform a much simpler task in determining the scaling factors $F_{SCALE}$.

With reference back to FIG. 2, the delay equalizer circuit 40 receives the time-variant input vector $\vec{b}_{MOD}$ from the digital processing circuit 30. The delay equalizer circuit 40 then applies the first complex filter $H_\tau(s)$ to the time-variant input vector $\vec{b}_{MOD}$ to thereby convert the variable group delay $T_1(P_{IN})$-$\tau_M(P_{IN})$ into the constant group delays $\tau_1$-$\tau_M$ relative to the time-variant amplitude AM(t) in each of the transmission frequencies $F_1$-$F_M$. Accordingly, the delay equalizer circuit 40 generates a delay-equalized vector $\vec{b}_{MOD\text{-}\tau}$ from the time-variant input vector $\vec{b}_{MOD}$. Understandably, the delay-equalized vector $\vec{b}_{MOD\text{-}\tau}$ will be associated with the time-variant amplitude AM(t) and has the constant group delays $\tau_1$-$\tau_M$ relative to the time-variant amplitude AM(t) in each of the transmission frequencies $F_1$-$F_M$.

The phase correction circuit 42 is configured to determine, based on the delay-equalized vector $\vec{b}_{MOD\text{-}\tau}$, a phase correction term $\Delta\phi_{CORR}$ to correct the AM-PM error $\phi_{ERR}$ in the RF signal 34. Accordingly, the phase correction circuit 42 applies the determined phase correction term $\Delta\phi_{CORR}$ to the delay-equalized vector $\vec{b}_{MOD\text{-}\tau}$ to generate a delay-phase-equalized vector $\vec{b}_{MOD\text{-}\tau}$. The signal conversion circuit 32 will generate the RF signal 34 based on the delay-phase-equalized vector $\vec{b}_{MOD\text{-}\tau}$ to thereby correct the AM-PM error $\phi_{ERR}$ in the RF signal 34.

Figure 4:
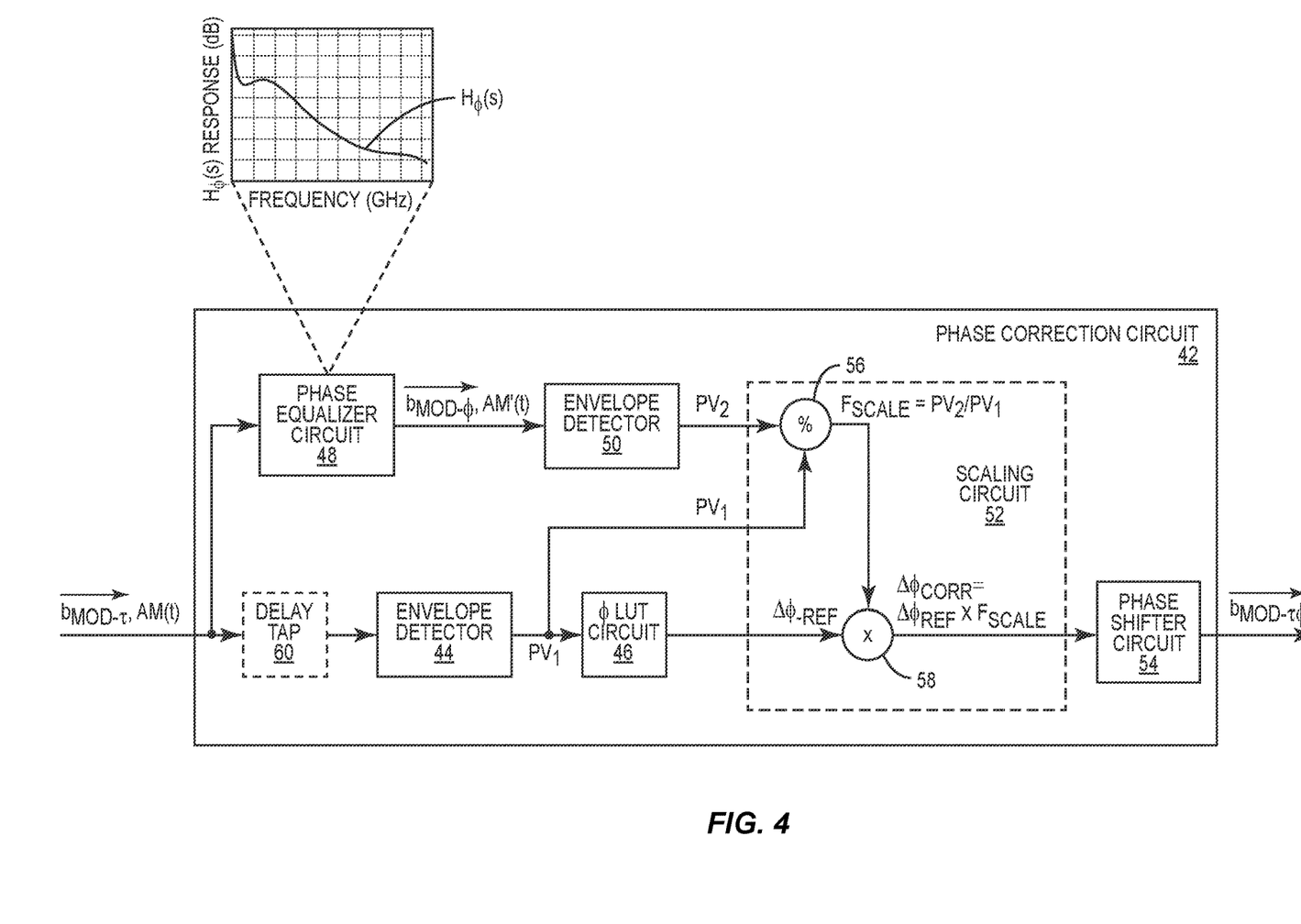
FIG. 4 is a schematic diagram providing an exemplary illustration of a phase correction circuit in the transceiver circuit in FIG. 2 according to one embodiment of the present disclosure.
Figure 5:
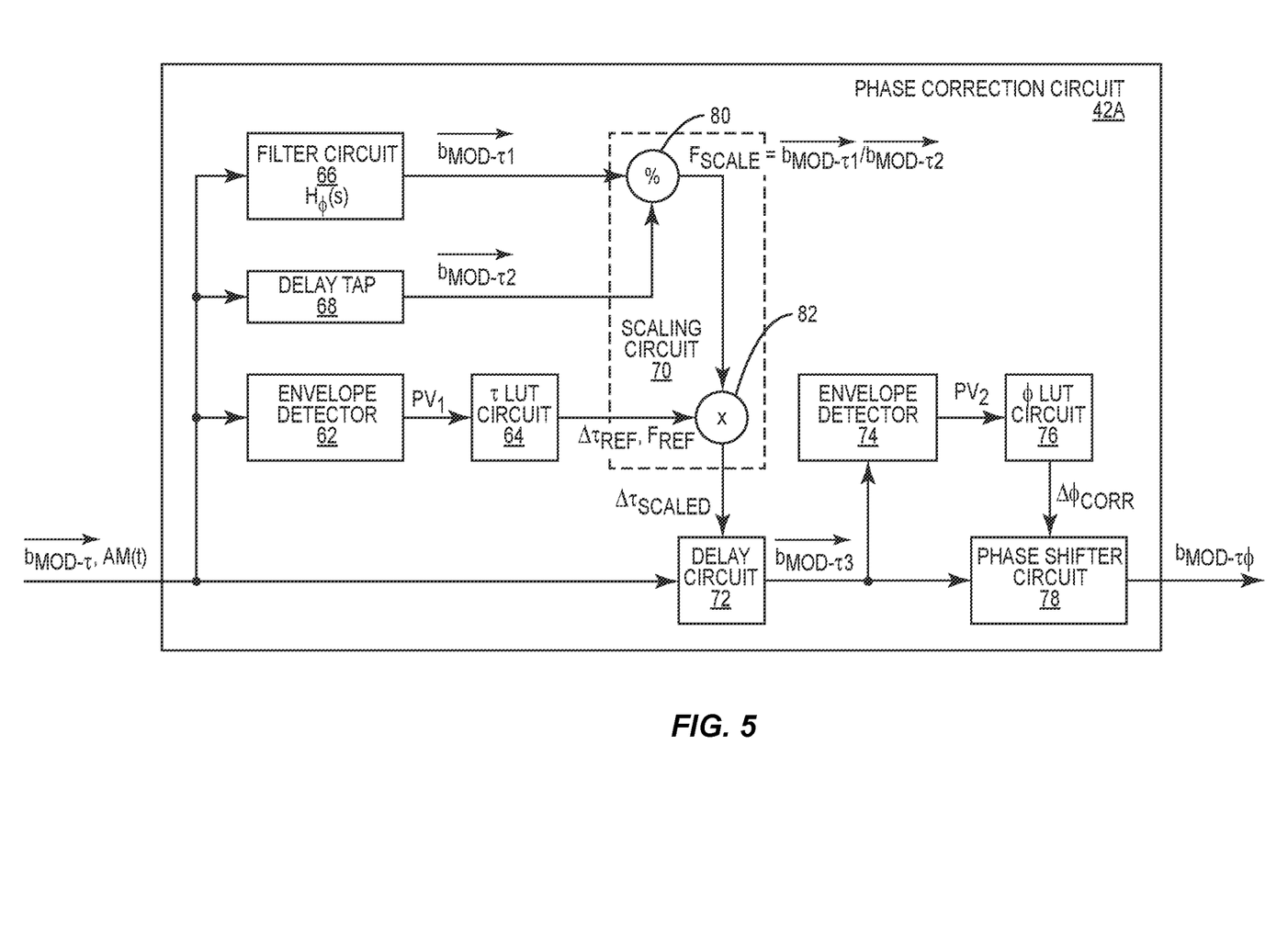
FIG. 5 is a schematic diagram providing an exemplary illustration of a phase correction circuit in the transceiver circuit in FIG. 2 according to another embodiment of the present disclosure.

The phase correction circuit 42 can be configured according to various embodiments of the present disclosure, as described in detail in FIGS. 4 and 5. Common elements between FIGS. 2, 4, and 5 are shown therein with common element numbers and will not be re-described herein.

FIG. 4 is a schematic diagram providing an exemplary illustration of the phase correction circuit 42 in the transceiver circuit 28 in FIG. 2 according to one embodiment of the present disclosure. Herein, the phase correction circuit 42 includes a first envelope detector 44, a phase correction lookup table (LUT) circuit 46, a phase equalizer circuit 48, a second envelope detector 50, a scaling circuit 52, and a phase shifter circuit 54.

The first envelope detector 44 is configured to detect a first power envelope $PV_1$ associated with the time-variant amplitude AM(t) of the delay-equalized vector $\vec{b}_{MOD\text{-}\tau}$. The phase correction LUT circuit 46 is configured to determine a reference phase offset $\Delta\phi_{REF}$ corresponding to the reference frequency $F_{REF}$ in FIG. 3B based on the detected first power envelope $PV_1$.

The phase equalizer circuit 48, which can be a finite impulse response (FIR) filter, is configured to apply a second complex filter $H_\phi(s)$ to the delay-equalized vector $\vec{b}_{MOD\text{-}\tau}$ for a respective one of the transmission frequencies $F_1$-$F_M$. Accordingly, the phase equalizer circuit 48 can generate a phase-equalized vector $\vec{b}_{MOD\text{-}\phi}$ having a second time-variant amplitude AM'(t). The second envelope detector 50 is configured to determine a second power envelope $PV_2$ associated with the second time-variant amplitude AM'(t).

In an embodiment, the scaling circuit 52 includes a divider 56 and a multiplier 58. The divider 56 is configured to divide the second power envelope $PV_2$ by the first power envelope $PV_1$ to thereby determine a scaling factor $F_{SCALE}$. In this regard, the scaling factor $F_{SCALE}$ can be said to be a function of the first power envelope $PV_1$ and the second power envelope $PV_2$. The multiplier 58 is configured to multiply the reference phase offset $\Delta\phi_{REF}$ by the scaling factor $F_{SCALE}$ to thereby generate the phase correction term $\Delta\phi_{CORR}$. Herein, a mutilation of the reference phase offset $\Delta\phi_{REF}$ by the scaling factor $F_{SCALE}$ is equivalent to superimposing the variable reference phase error $\Delta\phi_{REF}(P_{IN})$ associated with the reference frequency $F_{REF}$ on one of the variable phase errors $\Delta\phi_1(P_{IN})$-$\Delta\phi_M(P_{IN})$ associated with a respective one of the transmission frequencies $F_1$-$F_M$, as shown in FIG. 3B.

The phase shifter circuit 54 is configured to apply the phase correction term $\Delta\phi_{CORR}$ to the delay-equalized vector $\vec{b}_{MOD\text{-}\tau}$ to generate the delay-phase-equalized vector $\vec{b}_{MOD\text{-}\tau}$. The phase correction circuit 42 may further include a delay tap 60. In an embodiment, the delay tap 60 is configured to delay the delay-equalized vector $\vec{b}_{MOD\text{-}\tau}$ to thereby align the first power envelope $PV_1$ with the second power envelope $PV_2$ at the divider 56.

FIG. 5 is a schematic diagram providing an exemplary illustration of a phase correction circuit 42A configured according to another embodiment of the present disclosure. Herein, the phase correction circuit 42A includes a first envelope detector 62, a delay LUT circuit 64, a filter circuit 66, a delay tap 68, a scaling circuit 70, a delay circuit 72, a second envelope detector 74, a phase correction LUT circuit 76, and a phase shifter circuit 78.

The first envelope detector 62 is configured to detect a first power envelope $PV_1$ associated with the time-variant amplitude AM(t) of the delay-equalized vector $\vec{b}_{MOD\text{-}\tau}$. The delay LUT circuit 64 is configured to determine a reference delay offset $\Delta\tau_{REF}$ corresponding to a reference frequency $F_{REF}$ based on the determined first power envelope $PV_1$. The filter circuit 66, which can be an FIR filter, is configured to apply a second complex filter $H_\phi(s)$ to the delay-equalized vector $\vec{b}_{MOD\text{-}\tau}$ to thereby generate a first delay-equalized vector $\vec{b}_{MOD\text{-}\tau1}$. The delay tap 68 is configured to delay the delay-equalized vector $\vec{b}_{MOD\text{-}\tau}$ to generate a second delay-equalized vector $\vec{b}_{MOD\text{-}\tau2}$.

The scaling circuit 70 includes a divider 80 and a multiplier 82. The divider 80 is configured to divide the first delay-equalized vector $\vec{b}_{MOD\text{-}\tau1}$ by the second delay-equalized vector $\vec{b}_{MOD\text{-}\tau2}$ to thereby generate a scaling factor $F_{SCALE}$. The multiplier 82 is configured to multiply the reference delay offset $\Delta\tau_{REF}$ by the scaling factor $F_{SCALE}$ to generate a delay correction term $\Delta\tau_{SCALED}$.

The delay circuit 72 is configured to apply the delay correction term $\Delta\tau_{SCALED}$ to the delay-equalized vector $\vec{b}_{MOD\text{-}\tau}$ to generate a third delay-equalized vector $\vec{b}_{MOD\text{-}\tau3}$ associated with the time-variant amplitude AM(t). The second envelope detector 74 is configured to detect a second power envelope $PV_2$ associated with the time-variant amplitude AM(t) of the third delay-equalized vector $\vec{b}_{MOD\text{-}\tau3}$. The phase correction LUT circuit 76 is configured to determine a phase correction term $\Delta\phi_{CORR}$ based on the determined second power envelope $PV_2$. Accordingly, the phase shifter circuit 78 can apply the phase correction term $\Delta\phi_{CORR}$ to the third delay-equalized vector $\vec{b}_{MOD\text{-}\tau3}$ to generate the delay-phase-equalized vector $\vec{b}_{MOD\text{-}\tau\phi}$.

With reference back to FIG. 2, the power amplifier circuit 36 is configured to amplify the RF signal 34 based on a modulated voltage Vcc, which can be an envelope tracking (ET) modulated voltage or an average power tracking (APT) modulated voltage. In this regard, the transmission circuit 26 can further include a power management integrated circuit (PMIC) 84 configured to generate the modulated voltage Vcc based on a modulated target voltage $V_{TGT}$. In an embodiment, the transceiver circuit 28 can further include a target voltage circuit 86 configured to generate the modulated target voltage $V_{TGT}$ based on the time-variant amplitude AM(t) of the time-variant input vector $\vec{b}_{MOD}$.

Those skilled in the art will recognize improvements and modifications to the preferred embodiments of the present disclosure. All such improvements and modifications are considered within the scope of the concepts disclosed herein and the claims that follow.

What is claimed is:

1. A transceiver circuit comprising:
  a delay equalizer circuit configured to:
    receive a time-variant input vector modulated for transmission in a plurality of transmission frequencies, the time-variant input vector is associated with a time-variant amplitude and a variable group delay that varies in accordance with the time-variant amplitude in each of the plurality of transmission frequencies;
    equalize the time-variant input vector to thereby convert the variable group delay in each of the plurality of transmission frequencies into a respective constant group delay across the time-variant amplitude such that a respective variable phase error associated with the variable group delay in each of the plurality of transmission frequencies can become linearly related; and
    generate a delay-equalized vector associated with the time-variant amplitude and having the respective constant group delay in a respective one of the plurality of transmission frequencies; and
  a phase correction circuit configured to:
    determine a reference phase offset corresponding to a reference frequency selected among the plurality of transmission frequencies;
    superimpose the reference phase offset on the respective variable phase error of the respective one of the plurality of transmission frequencies to thereby determine a phase correction term configured to correct the respective variable phase error in the respective one of the plurality of transmission frequencies; and
    apply the determined phase correction term to the delay-equalized vector to generate a delay-phase-equalized vector.

2. The transceiver circuit of claim 1, further comprising:
  a digital processing circuit configured to generate the time-variant input vector having the time-variant amplitude; and
  a signal conversion circuit configured to generate a radio frequency (RF) signal based on the delay-phase-equalized vector.

3. The transceiver circuit of claim 1, wherein the phase correction circuit comprises:
  a first envelope detector configured to detect a first power envelope associated with the time-variant amplitude of the delay-equalized vector;
  a phase correction lookup table (LUT) circuit configured to determine the reference phase offset corresponding to the reference frequency based on the detected first power envelope;
  a phase equalizer circuit configured to equalize the delay-equalized vector to generate a phase-equalized vector having a second time-variant amplitude;
  a second envelope detector configured to determine a second power envelope associated with the second time-variant amplitude;
  a scaling circuit configured to:
    determine a scaling factor as a function of the first power envelope and the second power envelope; and
    scale the reference phase offset based on the determined scaling factor to thereby generate the phase correction term; and
  a phase shifter circuit configured to apply the phase correction term to the delay-equalized vector to generate the delay-phase-equalized vector.

4. The transceiver circuit of claim 3, wherein the scaling circuit comprises:
  a divider configured to divide the second power envelope by the first power envelope to thereby determine the scaling factor; and
  a multiplier configured to multiply the reference phase offset by the scaling factor to thereby generate the phase correction term.

5. The transceiver circuit of claim 3, wherein the reference frequency is a center frequency among the plurality of transmission frequencies.

6. The transceiver circuit of claim 3, wherein the filter circuit is further configured to equalize the delay-equalized vector based on finite impulse response (FIR) filter.

7. The transceiver circuit of claim 3, wherein the phase correction circuit further comprises a delay tap configured to delay the delay-equalized vector to thereby align the first power envelope with the second power envelope at the scaling circuit.

8. The transceiver circuit of claim 1, wherein the phase correction circuit comprises:
a first envelope detector configured to detect a first power envelope associated with the time-variant amplitude of the delay-equalized vector;
a delay lookup table (LUT) circuit configured to determine a reference delay offset corresponding to the reference frequency based on the determined first power envelope;
a filter circuit configured to equalize the delay-equalized vector to generate a first delay-equalized vector;
a delay tap configured to delay the delay-equalized vector to generate a second delay-equalized vector;
a scaling circuit configured to:
determine a scaling factor as a function of the first delay-equalized vector and the second delay-equalized vector; and
scale the reference delay offset based on the determined scaling factor to thereby generate a delay correction term;
a delay circuit configured to apply the delay correction term to the delay-equalized vector to generate a third delay-equalized vector associated with the time-variant amplitude;
a second envelope detector configured to detect a second power envelope associated with the time-variant amplitude of the third delay-equalized vector;
a phase correction LUT circuit configured to determine the phase correction term based on the determined second power envelope; and
a phase shifter circuit configured to apply the phase correction term to the third delay-equalized vector to generate the delay-phase-equalized vector.

9. The transceiver circuit of claim 8, wherein the scaling circuit comprises:
a divider configured to divide the first delay-equalized vector by the second delay-equalized vector to thereby generate the scaling factor; and
a multiplier configured to multiply the reference delay offset by the scaling factor to generate the delay correction term.

10. The transceiver circuit of claim 8, wherein the reference frequency is a center frequency among the plurality of transmission frequencies.

11. The transceiver circuit of claim 8, wherein the filter circuit is further configured to equalize the delay-equalized vector based on finite impulse response (FIR) filter.

12. A transmission circuit comprising:
a power amplifier circuit configured to amplify a radio frequency (RF) signal based on a modulated voltage for transmission in a plurality of transmission frequencies; and
a transceiver circuit comprising:
a digital processing circuit configured to generate a time-variant input vector modulated for transmission in the plurality of transmission frequencies, the time-variant input vector is associated with a time-variant amplitude and a variable group delay that varies in accordance with the time-variant amplitude in each of the plurality of transmission frequencies;
a delay equalizer circuit configured to:
receive the time-variant input vector;
equalize the time-variant input vector to thereby convert the variable group delay in each of the plurality of transmission frequencies into a respective constant group delay across the time-variant amplitude such that a respective variable phase error associated with the variable group delay in each of the plurality of transmission frequencies can become linearly related; and
generate a delay-equalized vector associated with the time-variant amplitude and having the respective constant group delay in a respective one of the plurality of transmission frequencies;
a phase correction circuit configured to:
determine a reference phase offset corresponding to a reference frequency selected among the plurality of transmission frequencies;
superimpose the reference phase offset on the respective variable phase error of the respective one of the plurality of transmission frequencies to thereby determine a phase correction term configured to correct the respective variable phase error in the respective one of the plurality of transmission frequencies; and
apply the determined phase correction term to the delay-equalized vector to generate a delay-phase-equalized vector; and
a signal conversion circuit configured to generate the RF signal based on the delay-phase-equalized vector.

13. The transmission circuit of claim 12, further comprising a power management integrated circuit (PMIC) configured to generate the modulated voltage based on a modulated target voltage.

14. The transmission circuit of claim 13, wherein the transceiver circuit further comprises a target voltage circuit configured to generate the modulated target voltage based on the time-variant amplitude of the time-variant input vector.

15. The transmission circuit of claim 12, wherein the phase correction circuit comprises:
a first envelope detector configured to detect a first power envelope associated with the time-variant amplitude of the delay-equalized vector;
a phase correction lookup table (LUT) circuit configured to determine a reference phase offset corresponding to a reference frequency based on the detected first power envelope;
a phase equalizer circuit configured to equalize the delay-equalized vector to generate a phase-equalized vector having a second time-variant amplitude;
a second envelope detector configured to determine a second power envelope associated with the second time-variant amplitude;
a scaling circuit configured to:
determine a scaling factor as a function of the first power envelope and the second power envelope; and
scale the reference phase offset based on the determined scaling factor to thereby generate the phase correction term; and
a phase shifter circuit configured to apply the phase correction term to the delay-equalized vector to generate the delay-phase-equalized vector.

16. The transmission circuit of claim 15, wherein the scaling circuit comprises:

a divider configured to divide the second power envelope by the first power envelope to thereby determine the scaling factor; and a multiplier configured to multiply the reference phase offset by the scaling factor to thereby generate the phase correction term.

17. The transmission circuit of claim 15, wherein the reference frequency is a center frequency among the plurality of transmission frequencies.

18. The transmission circuit of claim 15, wherein the filter circuit is further configured to equalize the delay-equalized vector based on a finite impulse response (FIR) filter.

\* \* \* \* \*